US008735716B2

(12) United States Patent
Nagao et al.

(10) Patent No.: US 8,735,716 B2
(45) Date of Patent: *May 27, 2014

(54) SOLAR CELL AND METHOD FOR FABRICATING THE SAME (75) Inventors: Nobuaki Nagao, Gifu (JP); Takahiro Hamada, Osaka (JP); Akihiro Itoh, Kyoto (JP)

(73) Assignee: Panasonic Corporation, Osaka (JP)

( * ) Notice: Subject to any disclaimer, the term of this patent is extended or adjusted under 35 U.S.C. 154(b) by 28 days.

This patent is subject to a terminal disclaimer.

(21) Appl. No.: 13/547,939

(22) Filed: Jul. 12, 2012

(65) Prior Publication Data

US 2012/0273038 A1 Nov. 1, 2012

Related U.S. Application Data (63) Continuation of application No. 13/097,860, filed on Apr. 29, 2011, now Pat. No. 8,247,684, which is a continuation of application No. PCT/JP2010/006224, filed on Oct. 20, 2010.

(30) Foreign Application Priority Data

Oct. 21, 2009 (JP) .................... 2009-242006

(51) Int. Cl.
*H01L 31/0392* (2006.01)
*H01L 21/02* (2006.01)
*C30B 25/18* (2006.01)
*C23C 16/30* (2006.01)

(52) U.S. Cl.
CPC .......... *H01L 31/0392* (2013.01); *C30B 25/186* (2013.01); *H01L 21/02376* (2013.01); *C23C 16/303* (2013.01)
USPC ....... 136/255; 136/256; 438/93; 257/E31.019

(58) Field of Classification Search
CPC combination set(s) only.
See application file for complete search history.

(56) References Cited

U.S. PATENT DOCUMENTS 8,063,549 B2 11/2011 Nagao et al.
2002/0096106 A1 7/2002 Kub et al.
(Continued)

FOREIGN PATENT DOCUMENTS

JP 2009-200207 9/2009

OTHER PUBLICATIONS

Taniyasu et al., "MOVPE growth of single-crystal hexagonal AlN on cubic diamond," Journal of Cyrstal Growth, vol. 331, pp. 2825-2830 (2009).
O. Jani et al., "Design and characterization of GaN/InGaN solar cells," Applied Physics Letters, vol. 91, 132117 (2007).

(Continued)

*Primary Examiner* — Jennifer Michener
*Assistant Examiner* — Christopher Danicic
(74) *Attorney, Agent, or Firm* — McDermott Will & Emery LLP (57) ABSTRACT A solar cell includes a graphite substrate, an amorphous carbon layer having a thickness of not less than 20 nm and not more than 60 nm formed on the graphite substrate, an AlN layer formed on the amorphous carbon layer, a n-type nitride semiconductor layer formed on the AlN layer; a light-absorption layer including a nitride semiconductor layer formed on the n-type nitride semiconductor layer; a p-type nitride semiconductor layer formed on the light-absorption layer; a p-side electrode electrically connected to the p-type nitride semiconductor layer; and an n-side electrode electrically connected to the n-type nitride semiconductor layer. The amorphous carbon layer is obtained by oxidizing the surface of the graphite substrate.

6 Claims, 6 Drawing Sheets

(56) References Cited

U.S. PATENT DOCUMENTS

| | | | |
|---|---|---|---|
| 2002/0175389 A1* | 11/2002 | Shibata et al. | 257/458 |
| 2003/0089392 A1* | 5/2003 | Rohr et al. | 136/255 |
| 2006/0186556 A1* | 8/2006 | Sung | 257/798 |
| 2008/0223434 A1* | 9/2008 | Ikenoue et al. | 136/252 |
| 2009/0166509 A1* | 7/2009 | Kline | 250/201.1 |
| 2010/0320450 A1 | 12/2010 | Fujioka | |

OTHER PUBLICATIONS

Popov C. et al., "Characteristics of bonding structure of nanocrystalline diamond and amorphous carbon films prepared by plasma assisted techniques," (2007) Applied Physics A, vol. 89, pp. 209-212.

International Search REport, issued in corresponding International Patent Application No. PCT/JP2010/006224 on Nov. 22, 2010; 2 pages.

* cited by examiner

SOLAR CELL AND METHOD FOR FABRICATING THE SAME

This is a continuation of U.S. application Ser. No. 13/097,860, filed on Apr. 29, 2011 now U.S. Pat. No. 8,247,684, which is a continuation of International Application No. PCT/JP2010/006224, with an international filing date of Oct. 20, 2010, which claims priority of Japanese Patent Application No. 2009-242006, filed on Oct. 21, 2009, the contents of which are hereby incorporated by reference.

BACKGROUND OF THE INVENTION

1. Field of the Invention

The present invention relates to a solar cell composed of a nitride semiconductor.

2. Description of the Related Art

Recently, a semiconductor device composed of a nitride semiconductor such as gallium nitride (GaN) has been researched and developed actively. A semiconductor optical device made of nitride semiconductors such as aluminum nitride (AlN), gallium nitride (GaN), indium nitride (InN) or mixed crystal thereof absorbs light in a wide wavelength region from ultraviolet or blue to infrared by varying its film composition. The nitride semiconductor has a property of direct transition, and the light absorption coefficient thereof is as high as $10^4$ to $10^5$. Furthermore, compared with silicon (Si), which is a material widely used as a semiconductor material for a solar cell, the light absorption coefficient of the nitride semiconductor is more than one-hundred times higher than that of silicon. For this reason, as its application, a solar cell using a nitride semiconductor has been proposed (for example, see Omkar Jani et. al., Appl. Phys. Lett. Vol. 91 (2007)132117).

Figure 11:
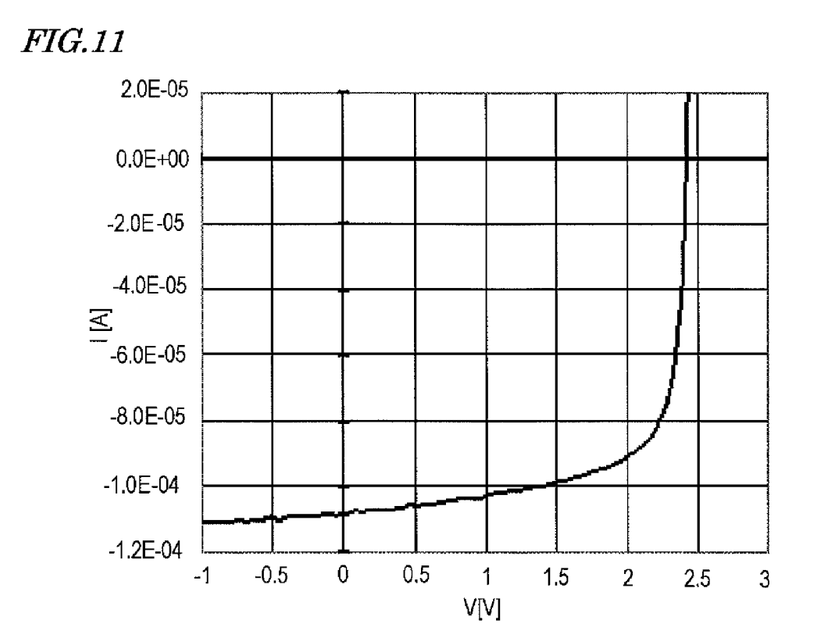
FIG. 11 is a graph showing an I-V property of the solar cell according to the embodiment 2 of the present invention.
Figure 12:
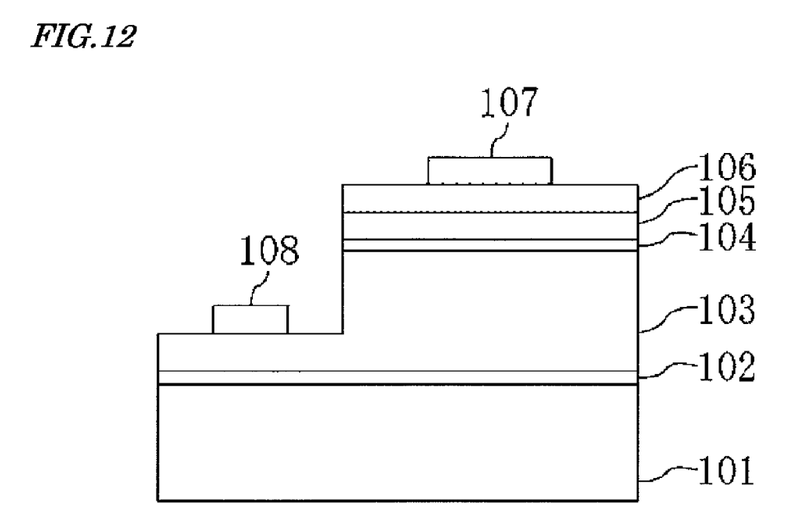
FIG. 12 shows a cross-sectional view of a conventional solar cell.

FIG. 11 shows a cross-sectional view of a solar cell according to prior art. As shown in FIG. 11, the conventional solar cell has a low-temperature grown buffer layer 102 consisting of GaN, an n-type GaN layer 103, a light absorption layer 104 consisting of $In_xGa_{1-x}N$, a p-type GaN layer 105, and a p-type contact layer 106 consisting of p-type GaN, all of which are formed on a sapphire substrate having a main surface with a (0001) surface orientation. A p-side electrode 107 is formed on the p-type contact layer 106. An n-side electrode 108 is formed on the selectively exposed region of on the n-type GaN layer 103.

According to the prior art, in order to suppress carrier recombination due to non-luminescence transition caused by lattice defects or threading dislocations, it is necessary to prepare a nitride semiconductor film having significantly low defects in the crystal. For this reason, a single-crystalline substrate such as a sapphire substrate has been used. Such a single-crystalline substrate, however, is very expensive.

In order to solve the above-mentioned problem, a method for preparing a polycrystalline nitride semiconductor film on a graphite substrate by a pulse sputtering method has been proposed (For example, see Japanese Laid-open patent publication No. 2009-200207).

SUMMARY OF THE INVENTION

However, since the GaN film prepared on the graphite substrate by the pulse sputtering method is polycrystalline and has many defects, it is not suitable for a solar cell. Furthermore, since the nitride semiconductor film prepared by a sputtering method is damaged severely due to discharged plasma during the film growth, it is well known that the crystal of the film contains an extremely large number of defects. Accordingly, in the method for preparing the nitride semiconductor by the pulse sputtering method according to Japanese Laid-open patent publication No. 2009-200207, it was very difficult to prepare a p-type GaN film necessary to prepare a solar cell.

The purpose of the present invention is to provide a high-performance solar cell at low cost with use of a graphite substrate, which is non-single-crystalline substrate, by a Metal Organic Chemical Vapor Deposition (MOCVD), which is most suitable for fabricating a semiconductor device.

The method of the present invention is a method for fabricating a solar cell, the method comprising steps of:

a step (a) of treating a surface of a graphite substrate with oxygen plasma treatment and forming an amorphous carbon layer with a thickness of not less than 20 nanometers and not more than 60 nanometers on the surface of the graphite substrate;

a step (b) of forming an AlN layer on the amorphous carbon layer with MOCVD (Metal Organic Chemical Vapor Deposition);

a step (c) of forming n-type nitride semiconductor layer on the AlN layer;

a step (d) of forming a light-absorption layer comprising a nitride semiconductor on the n-type nitride semiconductor layer;

a step (e) of forming a p-type nitride semiconductor layer on the light-absorption layer.

The solar cell of the present invention comprises:

a graphite substrate;

an amorphous carbon layer formed on the graphite substrate;

an AlN layer formed on the amorphous carbon layer;

a n-type nitride semiconductor layer formed on the AlN layer;

a light-absorption layer comprising a nitride semiconductor layer formed on the n-type nitride semiconductor layer;

a p-type nitride semiconductor layer formed on the light-absorption layer;

a p-side electrode electrically connected to the p-type nitride semiconductor layer;

an n-side electrode electrically connected to the n-type nitride semiconductor layer; wherein the amorphous carbon layer has a thickness of not less than 20 nanometers and not more than 60 nanometers.

The method of the present invention is a method for generating an electric power with a solar cell, the method comprises steps of:

a step (a) of preparing the solar cell comprising:

a graphite substrate;

an amorphous carbon layer formed on the graphite substrate;

an AlN layer formed on the amorphous carbon layer;

a n-type nitride semiconductor layer formed on the AlN layer;

a light-absorption layer comprising a nitride semiconductor layer formed on the n-type nitride semiconductor layer;

a p-type nitride semiconductor layer formed on the light-absorption layer;

a p-side electrode electrically connected to the p-type nitride semiconductor layer;

an n-side electrode electrically connected to the n-type nitride semiconductor layer; wherein the amorphous carbon layer has a thickness of not less than 20 nanometers and not more than 60 nanometers.

The present invention allows the preparation of the solar cell directly on the graphite substrate with MOCVD by providing the amorphous carbon layer on the graphite substrate and growing a c-axis oriented film of AlN with MOCVD on the amorphous carbon layer. The solar cell with excellent property is obtained at low cost.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

The embodiments of the present invention are described below with reference to the drawings. In the present specification, the same reference numerals are used to designate the same elements and parts, and therefore the overlapping description thereof can be omitted.

(Embodiment 1)

Figure 1:
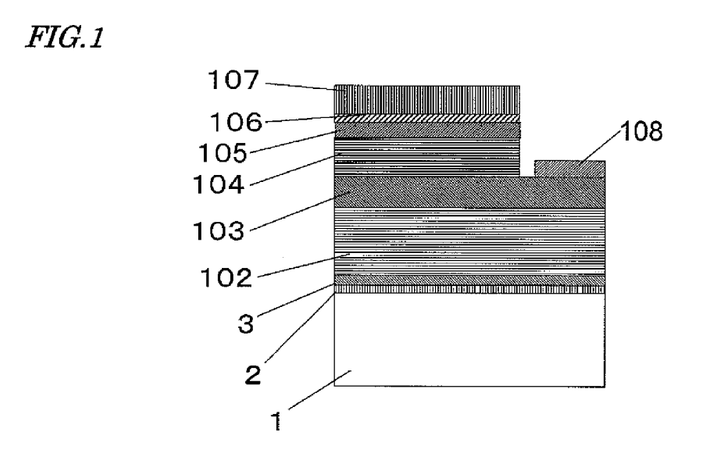
FIG. 1 shows a cross-sectional view of the solar cell according to the embodiment 1 of the present invention.

FIG. 1 shows a cross-sectional view of the solar cell according to the embodiment 1 of the present invention.

In FIG. 1, referential mark 1 indicates a graphite substrate. Referential mark 2 indicates an amorphous carbon layer which is caused to be amorphous by an oxygen-ashing treatment on the surface of the graphite substrate 1. The oxygen-ashing treatment includes a treatment by oxygen plasma. Referential mark 3 indicates an AlN layer formed on the amorphous carbon layer 2 with MOCVD.

A p-side electrode 107 which is a transparent electrode made of, for example, ITO (indium tin oxide) or a bilayer of nickel (Ni) and gold (Au) is formed on a p-type contact layer 106. An n-side electrode 108 made of a laminate film of titanium (Ti) and aluminum (Al) is formed on the upper surface of an n-type GaN layer 103.

A fabrication method of the solar cell is described below with reference to the drawings.

FIG. 2(a) to FIG. 2(d) show cross-sectional views in the process sequence of the fabrication method of the solar cell according to the embodiment 1.

In the embodiment 1, an MOCVD method is used as a crystal growth method of a group-III nitride semiconductor. A gallium source includes, for example, trimethylgallium (TMG). An aluminum source includes, for example, trimethylaluminum (TMA). An indium source includes, for example, trimethylindium (TMI). A group-V source (nitrogen source) includes, for example, ammonia ($NH_3$). An n-type dopant source includes silane ($SiH_4$). A p-type dopant source includes, for example, cyclopentadienylmagnesium ($CP_2Mg$).

Figure 2A:
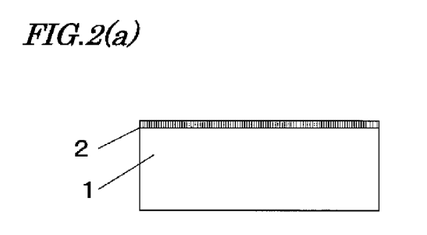
FIG. 2 shows a cross-sectional view of the method for fabricating the solar cell according to the embodiment 1 of the present invention.
Figure 2B:
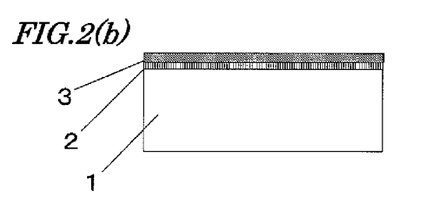
Figure 2C:
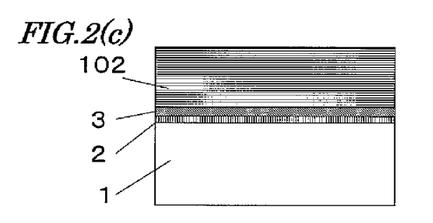
Figure 2D:
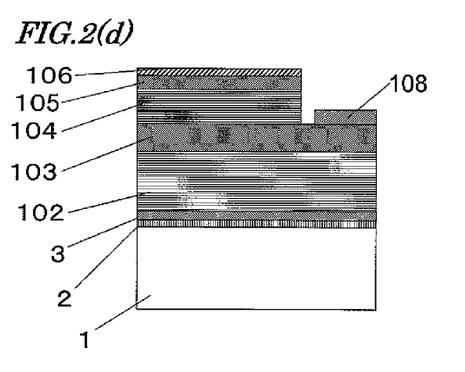

First, as shown in FIG. 2(a), the surface of the graphite substrate 1 is reformed by an oxygen-ashing method. Namely, the surface is caused to be amorphous. Thus, the amorphous carbon layer 2 is formed. Next, as shown in FIG. 2(b), the AlN layer 3 is grown by an MOCVD method on the amorphous carbon layer 2 at high temperature of approximately 960 degree Celsius. Next, as shown in FIG. 2(c), a low-temperature grown buffer layer 102 made of GaN is grown with a low temperature growth at temperature of, for example, approximately 500 degrees Celsius. Further, as shown in FIG. 2(d), the n-type cladding layer 103 made of n-type GaN formed with a high temperature growth at the temperature of approximately 900 degree Celsius, the light absorption layer 104 including $In_xGa_{1-x}N$ and GaN, the p-type cladding layer 105 made of p-type GaN, and the p-type contact layer 106 made of p-type GaN are grown in this order.

The amorphous carbon layer 2 is provided by the oxygen-ashing treatment on the surface of the graphite substrate 1. Furthermore, the AlN layer 3 is formed on the amorphous carbon layer 2 with MOCVD. These allow the fully-dense and c-axis oriented AlN layer 3 to be prepared. Accordingly, the formation of a high grade GaN thin film with a small amount of threading dislocations is achieved, although a graphite substrate, which is not a single-crystalline substrate, is used. This allows a GaN solar cell to be prepared directly on the graphite substrate.

Example 1

Figure 3A:
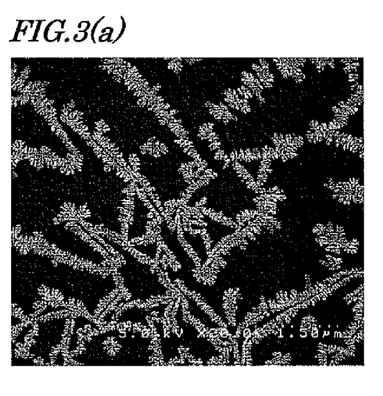
FIG. 3(a) shows a surface SEM observation image when the AlN was deposited with MOCVD on the graphite substrate which was not surface-treated in accordance with the embodiment 1 of the present invention.
Figure 3B:
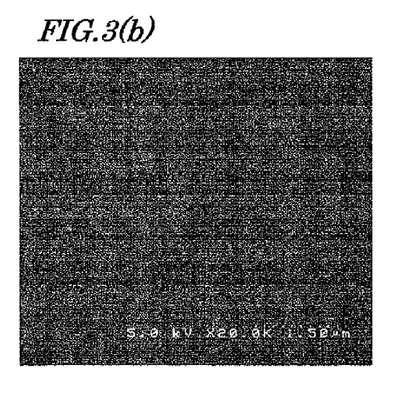
FIG. 3(b) shows a surface SEM observation image when the AlN was deposited with MOCVD on the graphite substrate which was provided with an amorphous carbon layer.

FIG. 3(a) shows the surface SEM observation image after AlN was deposited with MOCVD on the graphite substrate 1 where the surface treatment by the oxygen-ashing was not performed. FIG. 3(b) shows the surface SEM observation image after the AlN layer 3 with a thickness of 20 nanometers was formed with MOCVD on the graphite substrate provided with the amorphous carbon layer 2 with a thickness of 20 nanometers formed by the surface treatment of oxygen-ashing.

As is clear from FIG. 3(a), a dense AlN thin film was not formed on the graphite substrate 1 where the surface treatment of oxygen-ashing was not performed. Only a microcrystal such as a dendrite crystal was deposited. On the contrary, as is clear from FIG. 3(b), the dense AlN film was formed on the graphite substrate 1 provided with the amorphous carbon layer 2 on its surface.

Figure 4A:
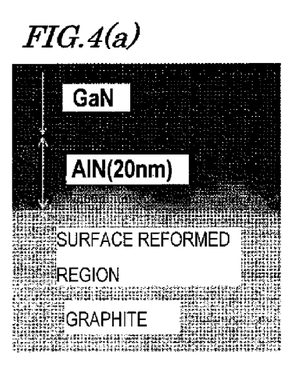
FIG. 4(a) shows a cross-sectional TEM observation image in the vicinity of the interface between the graphite substrate and the AlN layer in the embodiment 1 of the present invention.
Figure 4B:
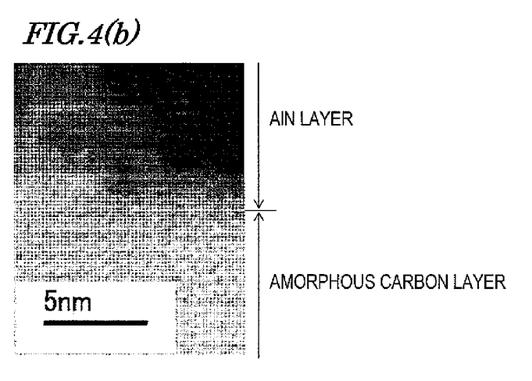
FIG. 4(b) shows a lattice image according to a high-resolution TEM.

FIG. 4(a) shows the cross-sectional TEM observation image of the substrate when the AlN layer 3 with a thickness of 20 nanometers formed with MOCVD, the GaN low-temperature grown buffer layer 102 with a thickness of 1 micrometer, and the n-type GaN nitride semiconductor layer 103 with a thickness of 200 nanometers were grown on the graphite substrate 1 provided with the amorphous carbon layer 2 with a thickness of 20 nanometers on its surface. FIG. 4(b) shows the observation result of the lattice image in the vicinity of the interface between the graphite substrate and the AlN layer with use of a high-resolution TEM.

From FIG. 4(a) and FIG. 4(b), it is understood that the dense AlN crystal was formed on the surface of the amorphous carbon layer, and the excellent GaN crystal was formed on the AlN crystal. The dislocation density calculated from the TEM observation was low. Particularly, the dislocation density was $2 \times 10^9$ cm$^{-2}$. This dislocation density is the same degree as that of the GaN thin film formed with use of a GaN low-temperature grown buffer layer on a sapphire substrate. It was discovered that the formation of the nitride thin film with high crystallinity even on a graphite substrate, which is non-single-crystalline, was achieved by providing the amorphous carbon layer 2 on the surface of the graphite substrate.

Figure 5:
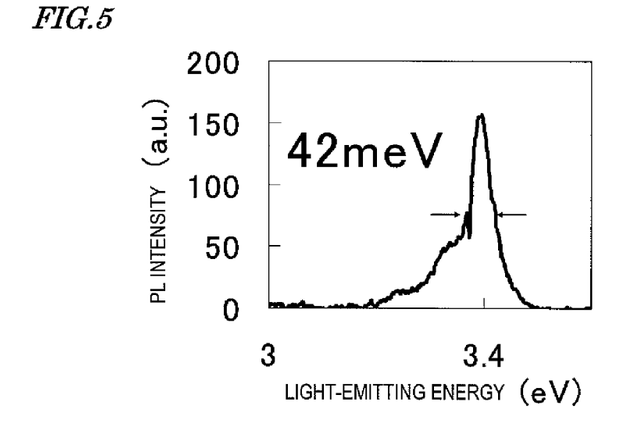
FIG. 5 is a graph showing a photoluminescence measurement result of the GaN film prepared on the graphite substrate according to the embodiment 1 of the present invention.

FIG. 5 shows the measurement result of the photoluminescence (PL) of the sample after the AlN layer 3 with a thickness of 20 nanometers formed with MOCVD, the GaN low-temperature grown buffer layer 102 with a thickness 1 micrometer, and the n-type GaN nitride semiconductor layer 103 with a thickness of 200 nanometers were grown on the graphite substrate 1 provided with the amorphous carbon layer 2 with a thickness of 20 nanometers. The excitation light source of the PL measurement was a He—Cd laser.

As is clear from FIG. 5, the luminescence peak from the n-type GaN nitride semiconductor layer 103 was observed in the vicinity of 3.4 eV. The half-value width was 42 meV, which was precipitous.

Table 1 shows the half-value widths of the PL luminescence peaks of samples after the AlN layer 3 with a thickness of 20 nm, the GaN low-temperature grown buffer layer 102, and the n-type GaN gladding layer 103 with a thickness of 200 nanometers were grown on the graphite substrate provided with the amorphous carbon layer with a thickness of nanometers and on the graphite substrate without the amorphous carbon layer.

TABLE 1

|  | Half-value width (meV) |
| --- | --- |
| Without the amorphous carbon layer | 62 |
| With the amorphous carbon layer | 42 |

As is clear from Table 1, the half-value width of the PL luminescence peak of the GaN layer on the graphite substrate without the amorphous carbon layer is 62 meV, while the half-value width of the PL luminescence peak of the GaN layer on the graphite substrate provided with the amorphous carbon layer is 42 meV. From Table 1, it is considered that the crystallinity of the AlN layer and the GaN layer thereon is improved and that non-luminescence transition derived from lattice defects is decreased, since the amorphous carbon layer is provided on the graphite substrate.

Presumably, the reason why the dense AlN thin film is grown by forming the amorphous carbon layer 2 by the oxygen-ashing treatment on the surface of the graphite substrate 1 is explained as below. In an ordinal graphite surface, electrons are delocalized due to pi bonds consisted of the sp$^2$ hybrid orbital of a graphene. On the other hand, in the surface reformed layer having the amorphous surface by the oxygen-ashing treatment, the pi bonds are fragmented anywhere. As a result, not only sp$^2$ orbital but also sp$^3$ orbital exist on the surface of the surface reformed layer.

Table 2 shows adsorption energies of an Al atom and an N atom with regard to the sp$^2$ orbital and the sp$^3$ orbital of a carbon, which are calculated in accordance with first principle calculation.

TABLE 2

| Adsorption Atom | sp$^2$ | sp$^3$ |
| --- | --- | --- |
| N | 447 | −49 |
| Al | 227 | −138 |

(Unit: kcal/mol)

As is clear from Table 2, the adsorption energies of the Al atom and the N atom with regard to sp$^2$ orbital are positive values, while those with regard to sp$^3$ orbital are negative values. This means that Al and N are easy to adsorb to sp$^3$ orbital spontaneously.

The amorphous carbon layer 2 is formed by the oxygen-ashing treatment on the surface of the graphite substrate. Presumably, this allows a lot of sp$^3$ orbitals of carbon to be formed, and promotes core formation at an initial stage of the AlN growth. As a result, an excellent crystalline film is grown.

Table 3 shows the half-value widths of (0002) peaks obtained with the rocking curve of XRD of the GaN when the amorphous carbon layers with various thicknesses are used. The thickness of the amorphous carbon layer can be varied by, for example, adjusting a treatment time in the oxygen-ashing.

TABLE 3

| Film thickness (nm) | Half-value width (arcsec) |
| --- | --- |
| 0 | — |
| 20 | 2700 |
| 40 | 2500 |
| 60 | 3200 |
| 80 | 10500 |

As long as the thickness of the amorphous carbon layer is not less than 20 nanometers and not more than 60 nanometers, the GaN film is c-axis-oriented and the film with excellent half-value width was obtained. When the thickness of the amorphous carbon layer exceeds about 80 nm, since the amount of the oxygen which moved into the graphite thin film during the oxygen-ashing treatment increases, in the subsequent growth of AlN and GaN with MOCVD, the oxygen which has moved into the graphite thin film reacts with Al or Ga. This prevents the formation of the precipitous interface. Accordingly, the thickness of the amorphous carbon layer 2 is preferably not less than 20 nanometers and not more than 60 nanometers.

After the luminescence peaks were measured, the multi-absorption layer 104 made of In$_{0.08}$Ga$_{0.92}$N, the p-type GaN layer 105, and the p-type GaN contact layer 106 were stacked on the n-type GaN cladding layer 103.

Figure 6:
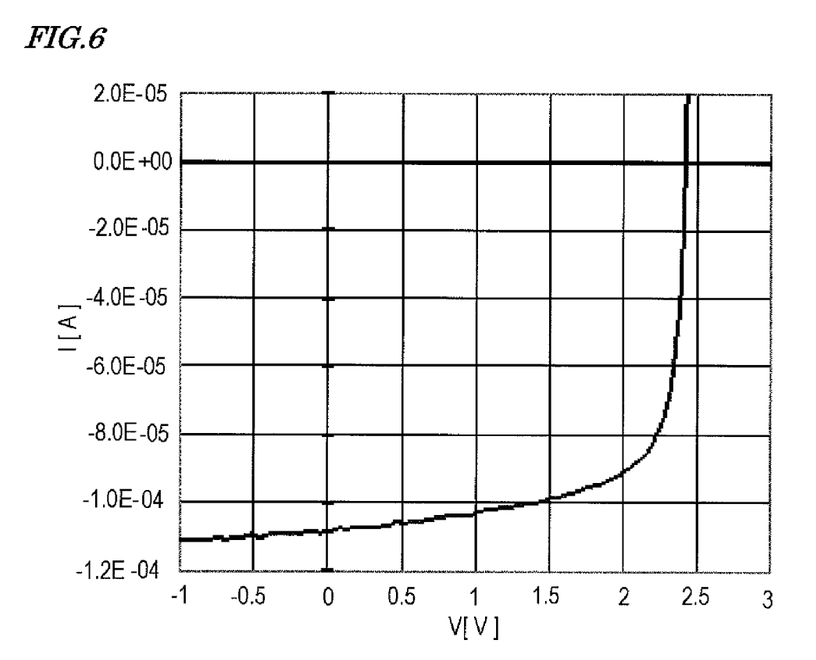
FIG. 6 is a graph showing an I-V property of the solar cell prepared on the graphite substrate according to the embodiment 1 of the present invention.

FIG. 6 shows the I-V property of the solar cell obtained by providing an ITO electrode with a thickness of 100 nanometers as the p-side electrode 107 on the p-type GaN contact layer 106 and dividing each of the elements with a dicer. The size of the element was 10 mm×10 mm.

As is clear from FIG. 6, the solar cell prepared on the graphite substrate according to the example 1 had an excellent I-V property. The open voltage Voc thereof was approximately 2.4 volts, and the fill factor FF thereof was approximately 0.8.

Figure 7:
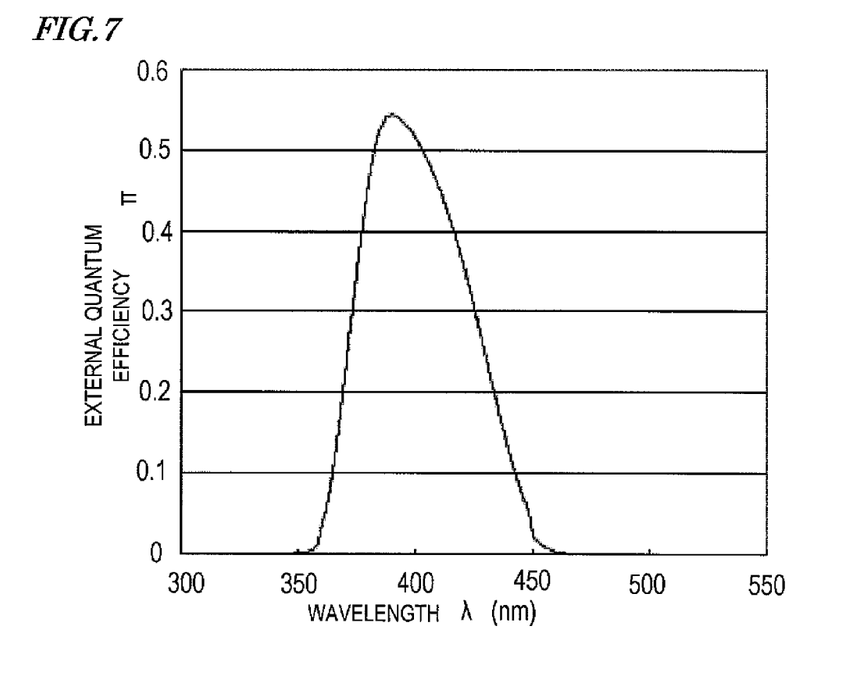
FIG. 7 is a graph showing the spectral sensitivity property of the solar cell prepared on the graphite substrate according to the embodiment 1 of the present invention.

FIG. 7 shows the spectral sensitivity property of the solar cell according to the example 1. An external quantum efficiency was measured by using a spectral sensitivity device (commercially-available from BUNKOUKEIKI Co., Ltd, trade name: CEP-25mL, DC mode). As is clear from FIG. 7, the maximum quantum efficiency was obtained in the vicinity of 390 nanometers due to the absorption peak of the $In_{0.08}Ga_{0.92}N$ layer, which was the light absorption layer 104.

As described above, in the example 1, the surface of the graphite substrate 1 was treated with oxygen ashing to provide the amorphous carbon layer 2. Furthermore, the AlN layer 3 was provided by MOCVD. This allows a GaN film with excellent crystallinity similar to that of a sapphire substrate to be prepared. More, a high-performance solar cell is obtained at low cost.

(Embodiment 2)

Figure 8:
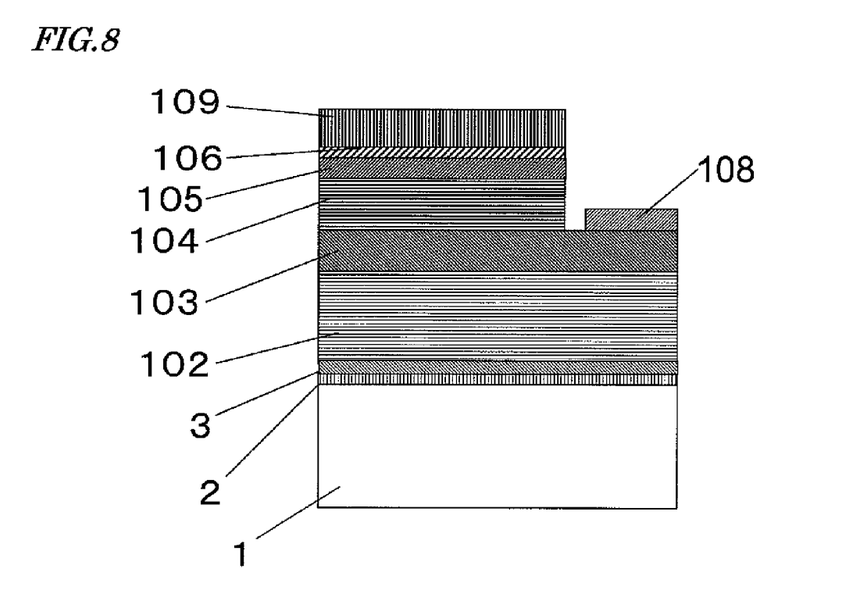
FIG. 8 shows a cross-sectional view of the solar cell according to the embodiment 2 of the present invention.

FIG. 8 shows a cross-sectional view of the solar cell according to the embodiment 2 of the present invention. The difference from FIG. 1 lies in that the p-side electrode 109 is a zinc oxide (ZnO) film prepared by liquid phase synthesis.

Example 2

The method of the liquid phase synthesis is described below.

Hexamethylenetetramine $((CH_2)_6N_4)$ at a concentration of 0.1 mol/L was dropped in a zinc nitrate $(ZnNO_3)$ solution at a concentration of 0.1 mol/L, and the pH was adjusted to 5 to 7. A photoresist film was applied onto the solar cell structure to expose only the p-type GaN contact layer 106 by photolithography. Then, the solar cell structure was immersed in the solution and stood still for two to six hours while the solution temperature was maintained at 70 degree Celsius. Thus, a ZnO film was grown on the p-type GaN contact layer. The thickness of the film was controlled by the growth period. The growth rate was approximately 2.7 nanometers/minute. After the ZnO film was grown, the resist was removed with acetone, and the solar cell was dried.

Figure 9:
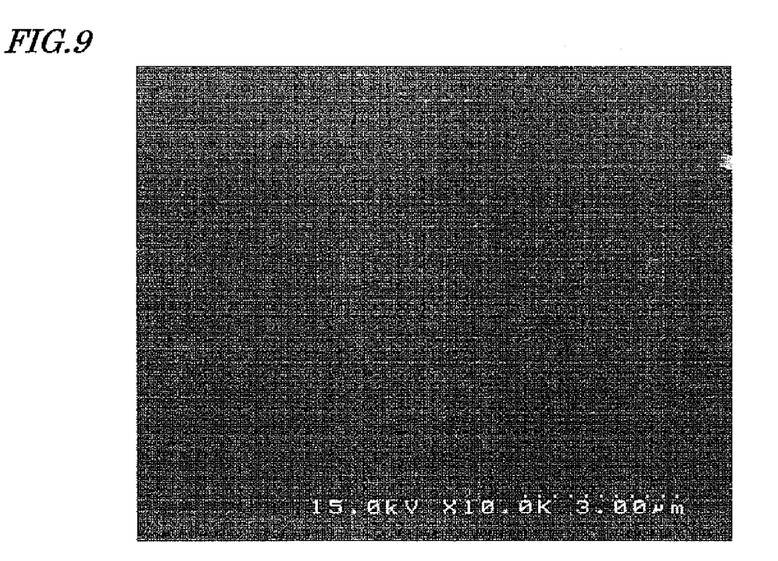
FIG. 9 is a microscope photograph showing the surface SEM observation image of a ZnO film grown on the p-type GaN film by liquid phase synthesis according to the embodiment 2 of the present invention.

FIG. 9 shows the surface SEM observation image when the ZnO with a thickness of 500 nanometers was grown.

Figure 10:
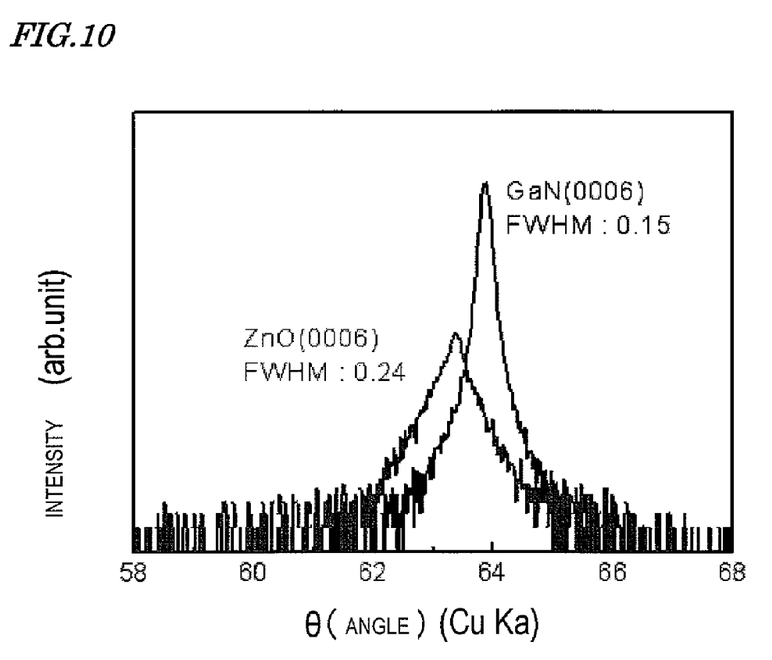
FIG. 10 is a graph showing a rocking curve of the (0006) peak, with use of XRD, of a ZnO film grown on a p-type GaN film by liquid phase synthesis according to the embodiment 2 of the present invention.

FIG. 10 shows the XRD rocking curve when the ZnO with a thickness of 500 nanometers was grown.

From FIG. 9 and FIG. 10, it is understood that the ZnO film grown on GaN by the liquid phase synthesis has a flat surface with high crystallinity. As the result of the UV-visible transmittance measurement, the transmittance of the ZnO film is not more than 95%, which is high, in a wide range of not less than 350 nanometers and not more than 2.5 micrometers. Furthermore, as the result of the resistivity measurement by a four-terminal method, the resistivity was relatively low. Particularly, it was $1.2 \times 10^{-2}$ ohm·cm. This resistivity means that the resultant ZnO film is sufficiently usable as a transparent electrode.

FIG. 11 shows the I-V property of the solar cell according to the present example 2, after each of the elements was divided with a dicer. As is clear from FIG. 11, the solar cell according to the present example 2, which was formed on the graphite, had an excellent I-V property identically to that of the example 1. The open voltage Voc thereof was approximately 2.4 volts, and the fill factor FF thereof was approximately 0.8. These values were similar to these of the example 1.

From these results, the preparation of the GaN film with high crystallinity similar to the case where a GaN film is formed on a sapphire substrate is achieved by providing the amorphous carbon layer by the oxygen-ashing treatment on the surface of the graphite substrate and then providing the AlN layer with MOCVD. As a result, a high-performance solar cell can be obtained at low cost.

The light absorption layer 104 is a multi-layered light absorption layer which was obtained by repeating alternate stacks of $In_xGa_{1-x}N$ (x=0.12) and GaN five times.

However, the structure is not limited to this example. For example, x may be not less than 0.01 and not more than 0.20, and the number of the stacking times may be not less than 1 and not more than 10.

The solar cell of the present invention has the amorphous carbon layer on the graphite substrate. The solar cell of the present invention has the AlN layer and the GaN layer both of which have high crystallinity by forming with MOCVD. The present invention is useful since it provides a high-performance solar cell at low cost. The technology of the solar cell of the present invention can also be applied to an electric device such as a light-emitting diode, a high-frequency device or a power device.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method for fabricating a solar cell, the method comprising steps of:
    treating a surface of a graphite substrate with oxygen plasma treatment and forming an amorphous carbon layer with a thickness of not less than 20 nanometers and not more than 60 nanometers on the surface of the graphite substrate;
    forming an AlN layer on the amorphous carbon layer with MOCVD (Metal Organic Chemical Vapor Deposition);
    forming n-type nitride semiconductor layer on the AlN layer;
    forming a light-absorption layer comprising a nitride semiconductor on the n-type nitride semiconductor layer; and
    forming a p-type nitride semiconductor layer on the light-absorption layer.

2. The method according to claim 1, further comprising a step of forming a buffer layer comprising a nitride semiconductor on the AlN layer before forming the n-type nitride semiconductor layer.

3. The method according to claim 1, further comprising a step of forming a p-side transparent electrode on the p-type nitride semiconductor layer.

4. The method according to claim 2, further comprising a step of forming a p-side transparent electrode on the p-type nitride semiconductor layer.

5. The method according to claim 1, wherein the light-absorption layer includes a multi-layered structure.

6. The method according to claim 4, wherein the light-absorption layer includes a multi-layered structure.

* * * * *